(12) United States Patent
Lin

(10) Patent No.: US 11,558,533 B2
(45) Date of Patent: Jan. 17, 2023

(54) METHOD OF READING DATA AND DATA-READING DEVICE

(71) Applicant: GENESYS LOGIC, INC., New Taipei (TW)

(72) Inventor: Ching-Hsiang Lin, New Taipei (TW)

(73) Assignee: GENESYS LOGIC, INC., New Taipei (TW)

( * ) Notice: Subject to any disclaimer, the term of this patent is extended or adjusted under 35 U.S.C. 154(b) by 112 days.

(21) Appl. No.: 17/325,251

(22) Filed: May 20, 2021

(65) Prior Publication Data

US 2021/0367605 A1 Nov. 25, 2021

(30) Foreign Application Priority Data

May 25, 2020 (TW) ................................. 109117397

(51) Int. Cl.
*H04L 7/00* (2006.01)
*H04L 25/00* (2006.01)
*H04L 25/40* (2006.01)
*H04N 5/04* (2006.01)
*G06F 13/42* (2006.01)

(52) U.S. Cl.
CPC ........... *H04N 5/04* (2013.01); *G06F 13/4282* (2013.01); *H04L 7/00* (2013.01); *H04L 7/002* (2013.01); *H04L 7/0025* (2013.01); *H04L 7/0029* (2013.01)

(58) Field of Classification Search
CPC ......... H04N 5/04; H04L 7/002; H04L 7/0029; H04L 7/0025; H04L 7/00; H04L 7/0331; H04L 7/0012; H04L 7/046; G11C 7/22; G06F 13/4291

USPC .......................................... 375/371, 373, 326
See application file for complete search history.

(56) References Cited

U.S. PATENT DOCUMENTS

| | | | |
|---|---|---|---|
| 6,907,096 B1* | 6/2005 | Lueker | H04L 7/046 375/354 |
| 9,147,463 B1* | 9/2015 | Sarraju | G11C 7/22 |
| 2005/0060052 A1* | 3/2005 | Fuller | H04L 7/0331 700/94 |
| 2012/0079138 A1* | 3/2012 | Obkircher | G06F 13/4291 710/15 |
| 2013/0163706 A1* | 6/2013 | Tai | H04L 7/0012 375/354 |
| 2017/0366330 A1* | 12/2017 | Chan | H04L 7/0331 |

\* cited by examiner

*Primary Examiner* — Phuong Phu
(74) *Attorney, Agent, or Firm* — Mark M. Friedman

(57) ABSTRACT

A method of reading data includes: receiving a digital signal, wherein the digital signal includes a sync signal and a data signal; performing an oversampling operation to the digital signal, and calculating a plurality of sampling points according to the oversampling operation; by a first counter counting the sampling points to obtain a first count value; based on the first count value defining a second count value; defining a unit interval; in the unit interval, defining a data reading range; and in the data reading range, reading the data signal corresponding to data of the unit interval as a first value when a potential of each of the sampling points counted is changed from a first potential to a second potential.

20 Claims, 10 Drawing Sheets

FIG. 5B

METHOD OF READING DATA AND DATA-READING DEVICE

FIELD OF INVENTION

The present invention relates to audiovisual fields, especially to a method of reading data and a data reading device.

BACKGROUND OF INVENTION

The DisplayPort is a digital multimedia interface standard set by the Video Electronics Standards Association (VESA). In the DisplayPort specification, a signal channel comprises a main link and an auxiliary channel. The main link is configured to transmit video data, and belongs to high speed one manner output. The auxiliary channel comprises an auxiliary signal pair configured to transmit information other than video data, for example information about status of a transmitter device and a receiver device, instructions for controlling the transmitter device and the receiver device, audio frequency, etc., and it belongs to low speed two-way communication and is configured to serve as communication between the transmitter device and the receiver device before the main link starts to transmit the video data.

FIG. 1 illustrates a conventional system framework diagram applied with a DisplayPort interface. With reference to FIG. 1, the DisplayPort interface comprises a main link 30, an auxiliary channel 31 and a hot plug detect (HPD) signal line 32. A transmission bandwidth of 1 Mbps provided by the auxiliary channel 31 is for two manner transmission between a transmitter device (source device) 1 and a receiver device (sink device) 2.

In the conventional chip design, to lower the cost and power, a method without phase-locked loops (PLLs) is employed. Therefore, if it is necessary to sample a transmission signal of the auxiliary channel 31, a ring oscillator clock can be used to sample the transmission signal. However, the designed method sometimes has variation of sampling frequency resulting from the pressure in the working environment, the temperature, the instantaneous voltage of a circuit, which causes sampling frequency to fluctuate to be imprecise. For example, when a frequency of a predetermined annular oscillator is 10 MHz, because influence of the pressure in the working environment, voltage, and temperature, an actual sampling frequency of the annular oscillator is merely 8 MHz, which does not reach an ideal value (i.e. 10 MHz). Alternatively, a first sampling frequency is 8 MHz, and a second sampling frequency is 8.5 MHZ, which has shifting frequency phenomenon. Because a sampling frequency of a conventional circular oscillator varies in a large range, it is challenging to correct obtain data.

SUMMARY OF INVENTION

The present invention provides a method of reading data and a data reading device that can use a high multiple frequency to perform over-sampling to synchronize a digital signal and correctly obtain data.

A method of reading data of the present invention, comprises: receiving a digital signal comprising a first frequency, wherein the digital signal comprises a sync signal and a data signal; generating a second frequency by an oscillator to perform an oversampling operation to the digital signal, and calculating a plurality of sampling points according to the oversampling operation, wherein the second frequency is greater than the first frequency; counting the sampling points by a first counter to obtain a first count value; defining a second count value based on the first count value; performing the oversampling operation of the second count value to the data signal by the second frequency to define a unit interval; in the unit interval, defining a data reading range; and in the data reading range, reading the data signal corresponding to data of the unit interval as a first value when a potential of each of the sampling points counted is changed from a first potential to a second potential, reading the data signal corresponding to the data of the unit interval as a second value when the potential of each of the sampling points counted is changed from the second potential to the first potential; wherein the first potential is different from the second potential, and the first value is different from the second value.

In an embodiment, method of reading data of the present invention further comprises: when the potential of each of the sampling points counted in the data reading range is changed from the first potential to the second potential or from the second potential to the first potential, a count value of the sampling point with the potential changed is recorded and defined as the first count value, and a count value of the first counter is reset as 0.

In an embodiment, the step of performing the oversampling operation to the digital signal comprises performing the oversampling operation to the sync signal to obtain the first count value before transfer of the data signal, wherein the step of performing the oversampling operation to the sync signal comprises: when the potential of each of the sampling points counted is changed from the first potential to the second potential, recording a count value corresponding to the sampling points with the potential changed, and resetting a count value of the first counter as 0 and is re-counts; and when the potential of each of the sampling points re-counted is changed from the first potential to the second potential once again, determining that whether the count value of each of the sampling points with the potential currently changed is twice or more than a previously recorded count value;

if yes, defining the count value recorded currently as the first count value, and resetting the count value of the first counter as 0, and performing transfer of the data signal.

In an embodiment, method of reading data of the present invention further comprises: when the potential of each of the sampling points counted with transfer of the data signal is changed from the first potential to the second potential, determining whether a count value of each of the sampling points with the potential currently changed is twice or more than a previously recorded count value; if yes, terminating the transfer of the data signal.

In an embodiment, method of reading data of the present invention further comprises: defining a count value of the first counter corresponding to each of the sampling points with the potential changed in each of the data reading ranges as the second count value; and storing the second count value by a register.

In an embodiment, method of reading data of the present invention further comprises: counting times of the sampling points when the data signal performs the oversampling operation by a second counter, wherein the oversampling operation is performed to the data signal in the unit interval according to the second count value, and when the unit interval is over, the second counter is reset as 0.

In an embodiment, the step of defining the data reading range comprising: defining counting times i to j of the second counter as the data reading range; wherein the counting time i is obtained from a calculation formula: $i=(m \div 4)+k$, the counting time j is obtained from a calculation formula: j=i+(m÷2), wherein m is the second count value; a remainder of m÷4 is 0 to 2, k is 0; when a remainder of m÷4 is 3, k is 1.

In an embodiment, method of reading data of the present invention further comprises: when the potential of each of the sampling points counted in the data reading range is changed from the first potential to the second potential or from the second potential to the first potential, comparing a count value of the first counter to a count value of the second counter on the sampling point with the potential changed; if the count value of the second counter on the sampling point with the potential changed is greater than a half of the count value of the first counter on the sampling point with the potential changed, increasing the counting times of the second counter; and if the count value of the second counter on the sampling point with the potential changed is less than the half of the count value of the first counter on the sampling point with the potential changed, decreasing the counting times of the second counter; wherein the counting times of the second counter are increased or decreased according to a difference between the half of the count value of the first counter on the sampling point with the potential changed and the count value of the second counter on the sampling point with the potential changed.

In an embodiment, a functional relationship is defined between the first count value and the second count value.

In an embodiment, the second frequency is n times the first frequency, and the n is an integer greater than 1.

A data reading device of the present invention is configured to read a digital signal comprising a first frequency, wherein the digital signal comprises a sync signal and a data signal, the data reading device comprises: an oscillator configured to generate a second frequency, wherein the second frequency is greater than the first frequency; a first counter configured to count the sampling points to obtain a first count value; and a control unit configured to perform: performing an oversampling operation to the digital signal by the second frequency, and calculating a plurality of sampling points according to the oversampling operation; defining a second count value based on the first count value; performing the oversampling operation of the second count value to the data signal by the second frequency to define a unit interval; in the unit interval, defining a data reading range; and in the data reading range, when a potential of each of the sampling points counted is changed from a first potential to a second potential, determining that data of the data signal corresponding to the unit interval is a first value, when the potential of each of the sampling points counted is changed from the second potential to the first potential, determining that data of the data signal corresponding to the unit interval is a second value, wherein the first potential is different from the second potential, and the first value is different from the second value.

In an embodiment, the control unit is configured to perform: when the potential of each of the sampling points counted in the data reading range is changed from the first potential to the second potential or from the second potential to the first potential, recording and defining a count value of the sampling point with the potential changed as the first count value, and resetting a count value of the first counter as 0.

In an embodiment, the control unit is configured to perform: performing the oversampling operation to the sync signal to obtain the first count value before transfer of the data signal; when the potential of each of the sampling points counted is changed from the first potential to the second potential, recording a count value corresponding to the sampling points with the potential changed, and resetting a count value of the first counter as 0, and re-counting; and when the potential of each of the sampling points re-counted is changed from the first potential to the second potential once again, determining that whether the count value of each of the sampling points with the potential currently changed is twice or more than a previously recorded count value; if yes, the count value recorded currently is defined as the first count value, and resetting the count value of the first counter as 0, and performing transfer of the data signal.

In an embodiment, the control unit is configured to perform: when the potential of each of the sampling points counted with transfer of the data signal is changed from the first potential to the second potential, determining whether a count value of each of the sampling points with the potential currently changed is twice or more than a previously recorded count value; if yes, terminating the transfer of the data signal.

In an embodiment, the data reading device further comprises a register, wherein the control unit is further configured to perform: defining a count value of the first counter corresponding to each of the sampling points with the potential changed in each of the data reading ranges as the second count value; and instructing the register to store the second count value.

In an embodiment, the data reading device further comprises a second counter configured to perform counting the data signal during the oversampling operation according to the second count value, wherein the control unit is configured to perform the oversampling operation to the data signal in the unit interval according to the second count value, and reset the second counter as 0 when the unit interval is over.

In an embodiment, the control unit is configured to perform: defining counting times i to j of the second counter as the data reading range; wherein the counting time i is obtained from a calculation formula: i=(m÷4)+k, the counting time j is obtained from a calculation formula: j=i+(m÷2), wherein m is the second count value; a remainder of m÷4 is 0 to 2, k is 0; when a remainder of m÷4 is 3, k is 1.

In an embodiment, the control unit is configured to perform: when the potential of each of the sampling points counted in the data reading range is changed from the first potential to the second potential or from the second potential to the first potential, comparing a count value of the first counter to a count value of the second counter on the sampling point with the potential changed; if the count value of the second counter on the sampling point with the potential changed is greater than a half of the count value of the first counter on the sampling point with the potential changed, increasing the counting times of the second counter; and if the count value of the second counter on the sampling point with the potential changed is less than the half of the count value of the first counter on the sampling point with the potential changed, decreasing the counting times of the second counter; wherein the counting times of the second counter are increased or decreased according to a difference between the half of the count value of the first counter on the sampling point with the potential changed and the count value of the second counter on the sampling point with the potential changed.

DESCRIPTION OF DRAWINGS

FIG. 5B illustrates data reading ranges corresponding to different unit intervals of the present invention.

DETAILED DESCRIPTION OF PREFERRED EMBODIMENTS

Figure 1:
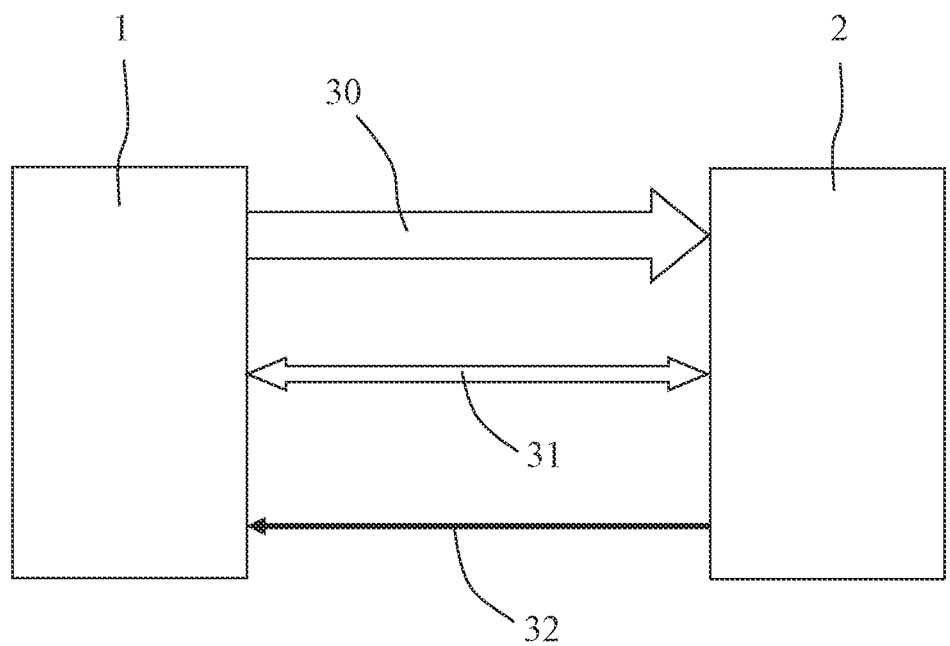
FIG. 1 illustrates a conventional system framework diagram of a DisplayPort interface.
Figure 2A:
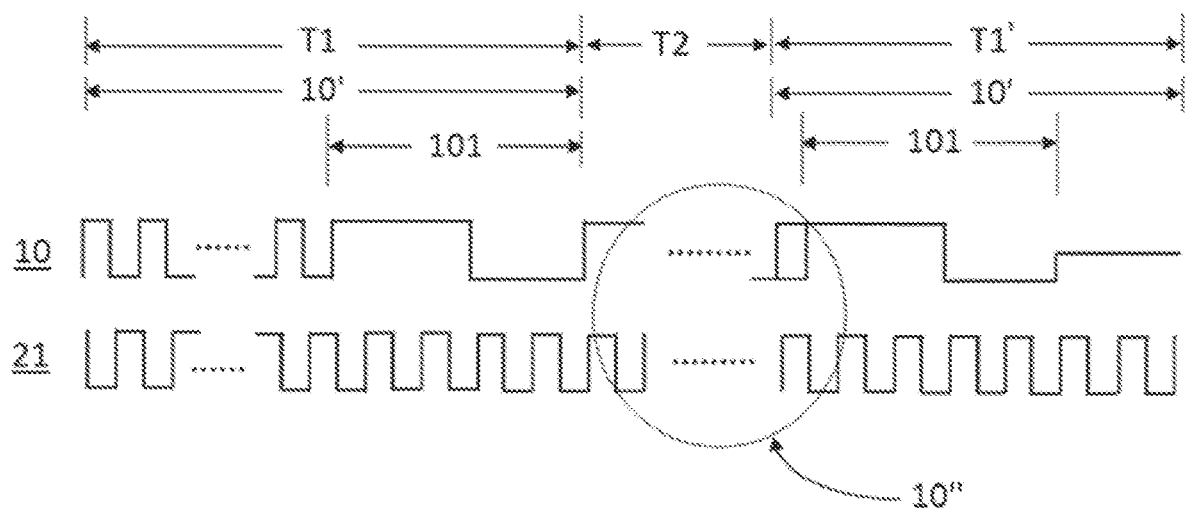
FIG. 2A illustrates a schematic timing diagram of a digital signal of the present invention.
Figure 2B:
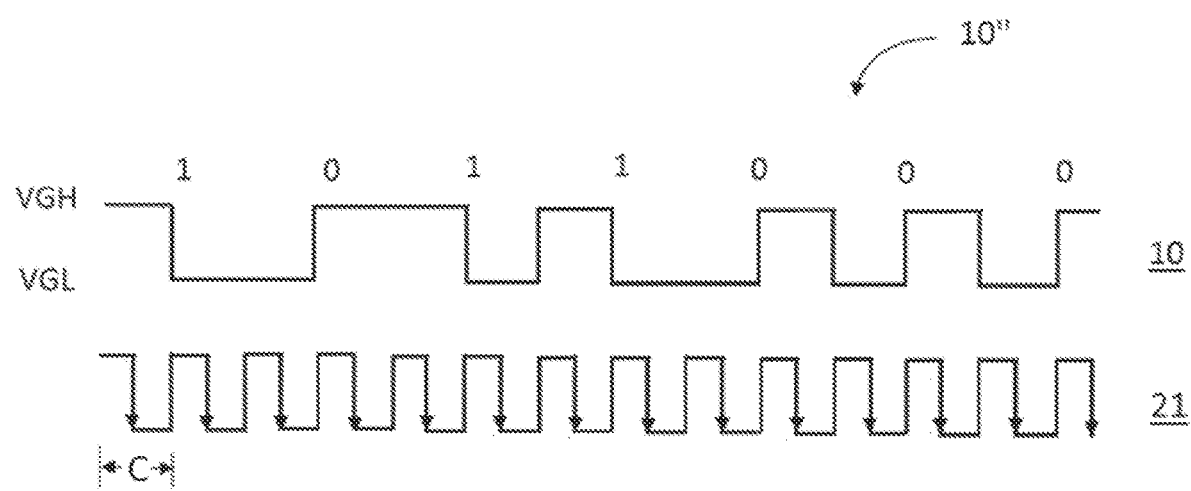
FIG. 2B illustrates enlarged timing diagram of a data signal in FIG. 2A of the present invention.

FIG. 2A illustrates a schematic timing diagram of a digital signal of the present invention. FIG. 2B illustrates enlarged timing diagram of a data signal in FIG. 2A of the present invention. With reference to FIG. 2A, a digital signal 10 transmitted in an auxiliary channel 31 (as shown in FIG. 1) comprises a sync signal 10' and a data signal 10". The sync signal and the data signal will be described in detail in FIG. 3A later. With reference to FIG. 2A, in an embodiment, the sync signal 10' and the data signal 10" are transfer in a signal synchronization stage T1 and a data transfer stage T2 respectively. For example, in the signal synchronization stage T1, a clock signal 21 of a receiving end continuously tracks the digital signal 10 to achieve frequency synchronization, and when a sync end signal 101 of the digital signal 10 is received at the receiving end, it is about to enter the data transfer stage T2. Then, in the data transfer stage T2, the receiving end samples the data signal 10" of the digital signal 10 in each clock cycle C (as shown in FIG. 2A and FIG. 2B), and when the sampled data signal 10" is changed from a high potential VGH to a low potential VGL, data of the data signal 10" is read by the receiving end as 1. On the contrary, when the sampled data signal 10" is changed from the low potential VGL to the high potential VGH, the data of the data signal 10" is read by the receiving end as 0. Later, if the receiving end receives the sync end signal 101 of the digital signal 10 again (as the second signal synchronization stage T1' in FIG. 2A), it indicates that signal transmission operation is terminated.

As described above, to effectively lower the cost and power consumption and maintain correctness of reading the data signal 10", the present invention defines a data reading range during transfer of the digital signal 10, and utilizes an oversampling operation to sample the digital signal 10 in the data reading range to further correctly read out contents of the data signal 10". Regarding the sync signal 10' of the present embodiment, the data signal 10" and the above oversampling operation will be explained in detail later in FIG. 3A.

Figure 3A:
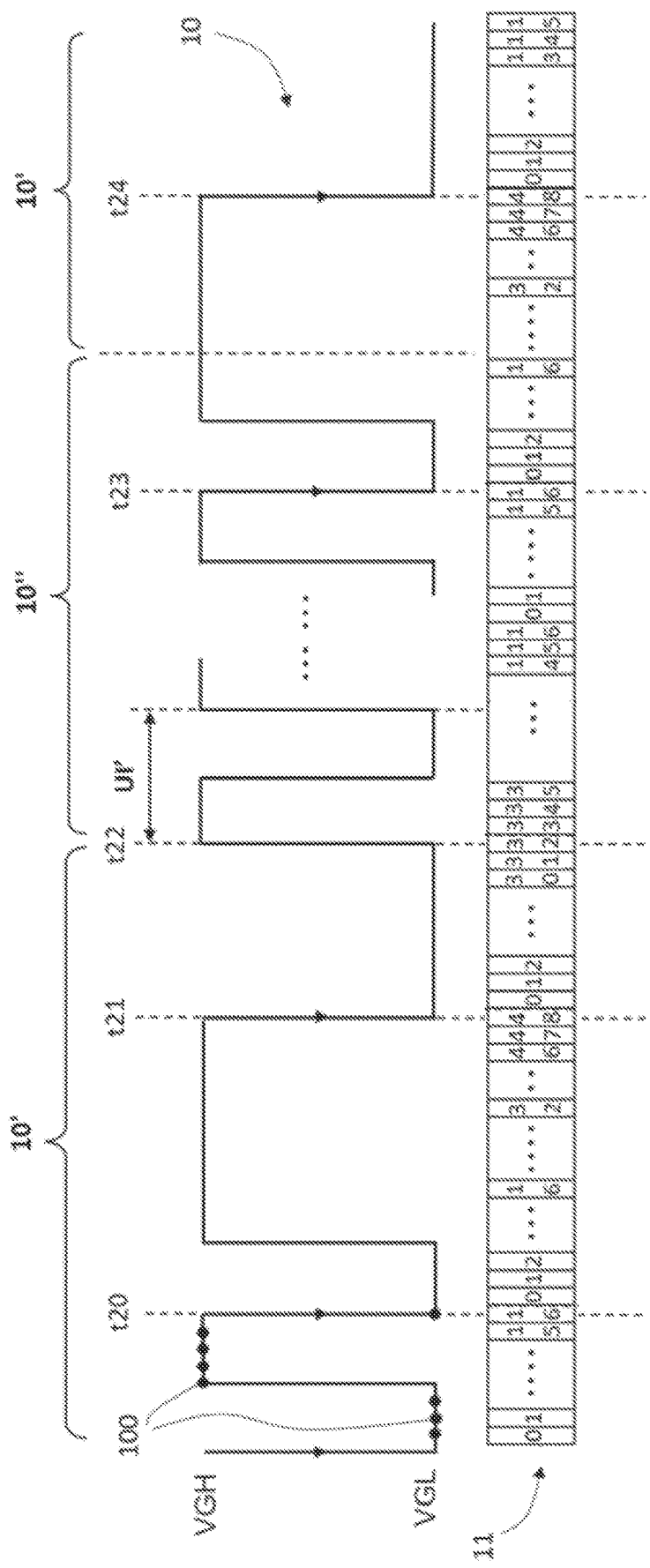
FIG. 3A illustrates a digital signal schematic view of a method of reading data of the present invention.
Figure 3B:
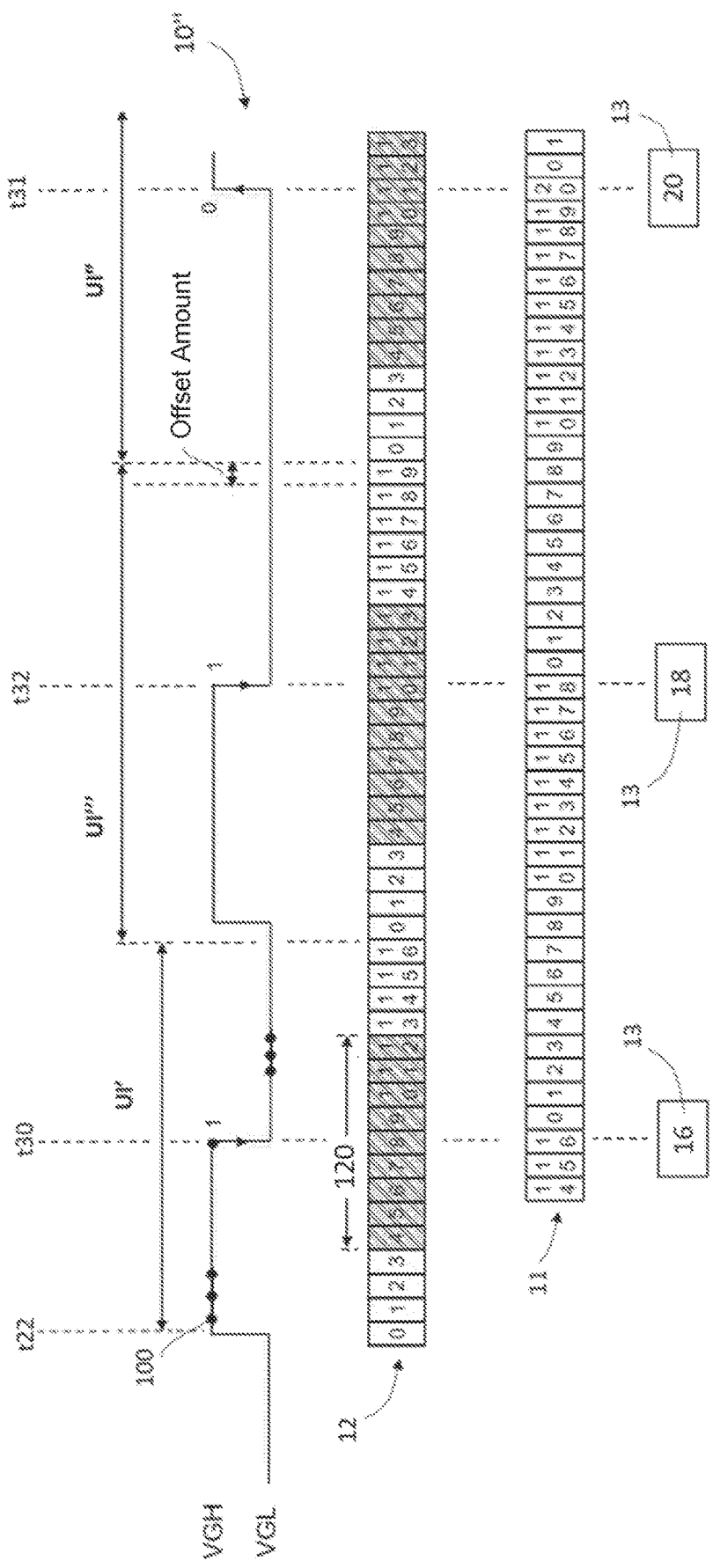
FIG. 3B illustrates an enlarged view of a data signal in FIG. 3A of the present invention.
Figure 4:
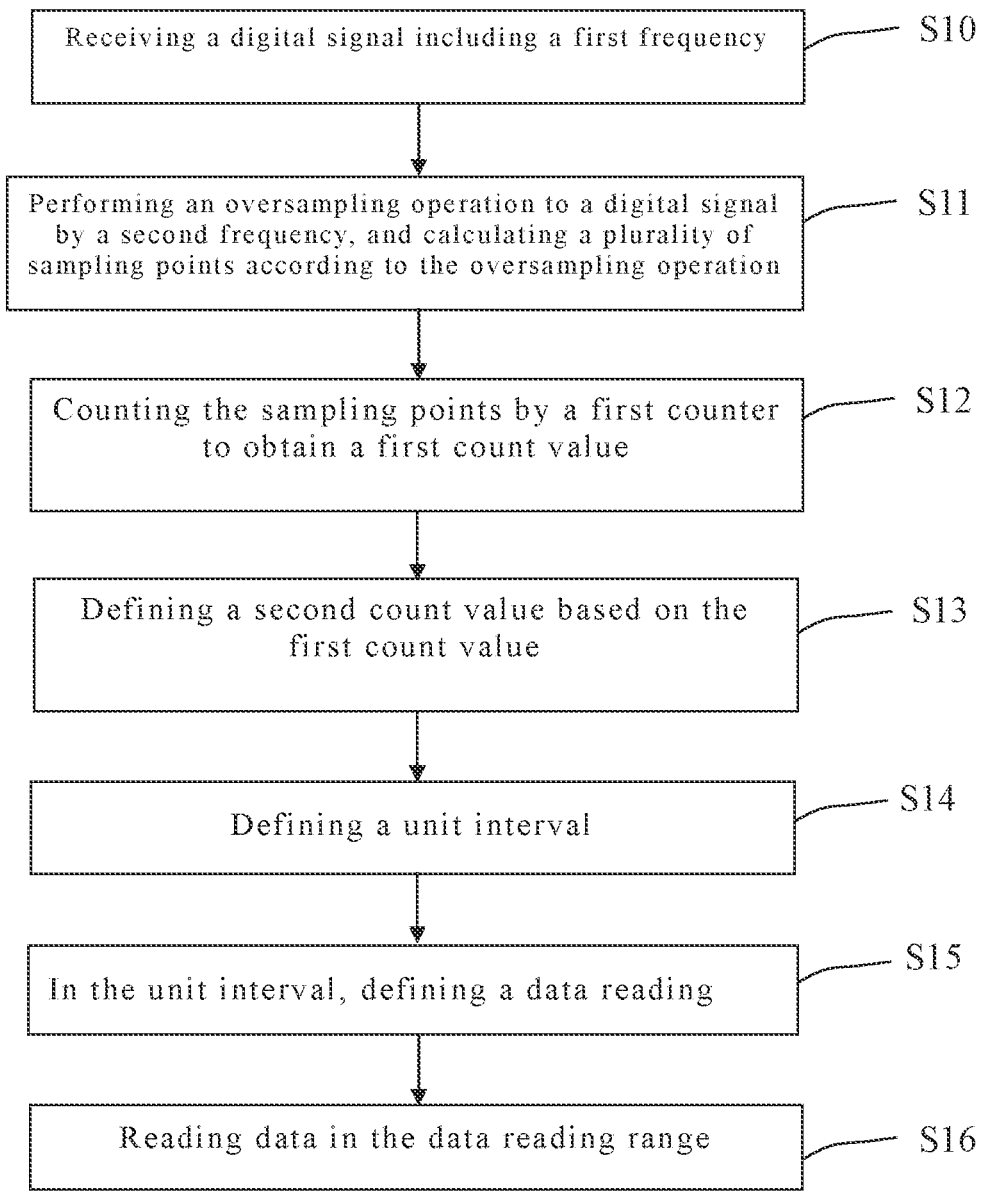
FIG. 4 illustrates a flowchart of a method of reading data of the present invention.
Figure 6:
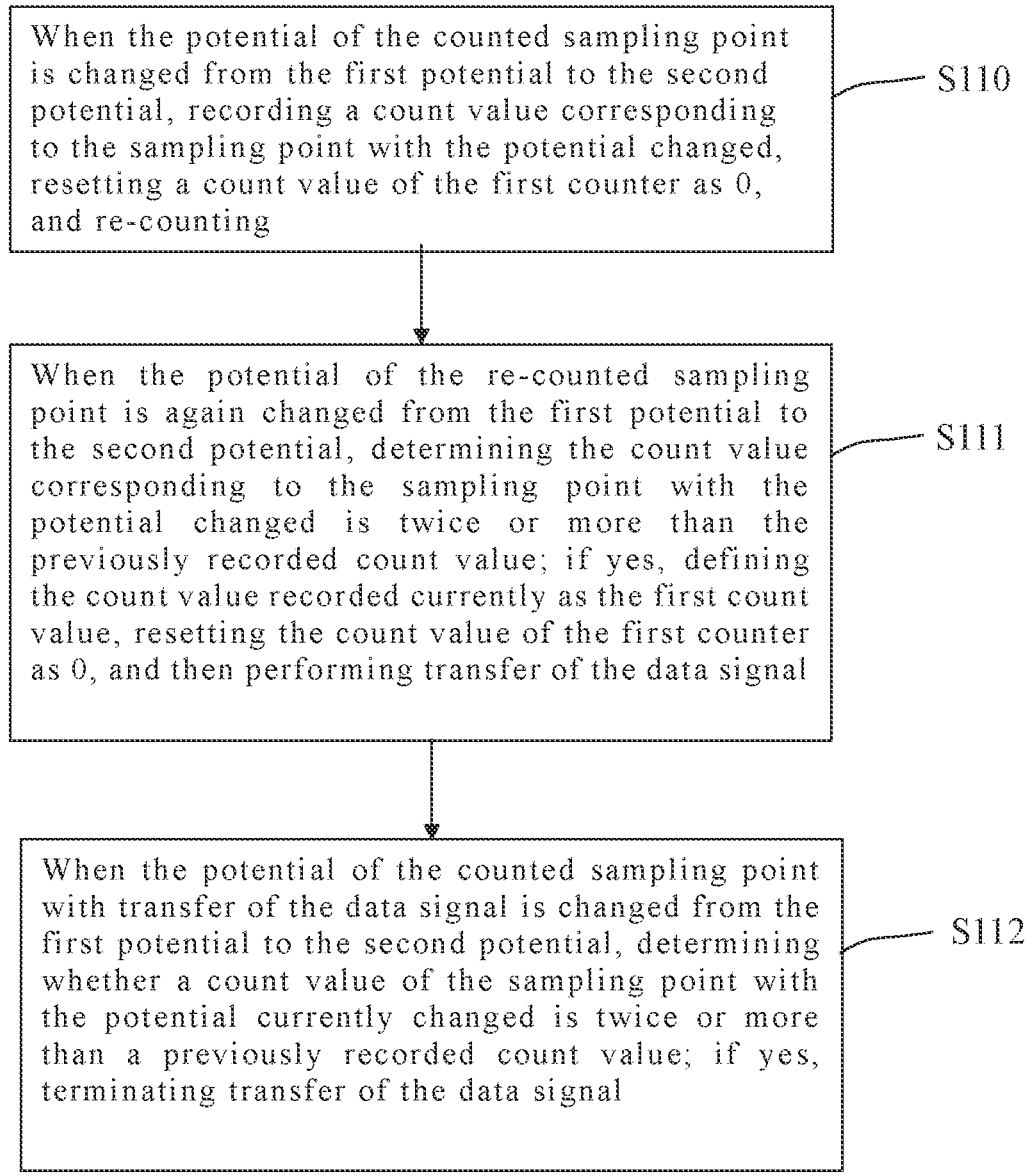
FIG. 6 illustrates a flowchart of the sync signal of the present invention performing the oversampling operation.

FIG. 3A illustrates a digital signal schematic view of a method of reading data of the present invention. FIG. 3B illustrates an enlarged view of a data signal 10" in FIG. 3A of the present invention. FIG. 4 illustrates a flowchart of a method of reading data of the present invention. For example, the present invention can be applied to an electronic device including a DisplayPort interface. FIG. 6 illustrates a flowchart of the sync signal of the present invention performing the oversampling operation. With further reference to FIGS. 3A-3B and FIG. 4, the method of reading data of the present invention comprises steps as follows.

First, a step S10 comprises receiving a digital signal 10 including a first frequency. The digital signal 10 comprises a sync signal 10' and a data signal 10". In the present embodiment, the first frequency, for example, is 1 MHz.

Then, a step S11 comprises performing an oversampling operation to a digital signal by a second frequency, and calculating a plurality of sampling points according to the oversampling operation. In an embodiment, an oscillator is employed to generate a second frequency to perform an oversampling operation to the digital signal 10, and a plurality of sampling points 100 is calculated according to the oversampling operation. wherein the second frequency is greater than the first frequency. In a preferred embodiment, the second frequency is n times the first frequency. In other embodiment, n, for example, is an integer greater than 1, but is not limited thereto. The above oscillator can be a circular oscillator or other adequate oscillator. In the present embodiment, for convenience of explanation, the second frequency, for example is 16 MHz, namely, n is 16.

Then, a step S12 comprises counting the sampling points 100 by a first counter 11 to obtain a first count value (value of 16 or 48 of the first counter 11 as shown in FIG. 3A). It is worth mentioning that during the present embodiment performing the oversampling operation to the sync signal 10' and the data signal 10", definition ways of the first count value would be different, not are not limited. As such, the present invention first explains the definition manner of the first count value during the oversampling operation to the sync signal 10'.

As described above, in the present embodiment, the oversampling operation to the sync signal 10' is as shown in FIG. 6. The steps S110 to S111 as shown in FIG. 6 are for explaining the definition manner of the first count value before transfer of the data signal 10". With reference to FIG. 3A and FIG. 6, first, when the potential of each of the counted sampling points 100 is changed from the first potential to the second potential, a count value corresponding to the sampling point 100 with the potential changed is recorded, and a count value of the first counter 11 is reset as 0, and re-counting is performed (as the step S110 in FIG. 6). Furthermore, with reference to FIG. 3A for clear understanding, when the potential of each of the counted sampling points 100 is changed from the high potential VGH (first potential) to the low potential VGL (second potential), a count value corresponding to the sampling point with the potential changed would be recorded, and the count value of the first counter 11 is reset as 0, and re-counting is performed.

For instance, in FIG. 3A, at a time t20, the potential corresponding to the sampling point sampled is changed from the high potential VGH to the low potential VGL, and a value of the first counter 11 is 16. Therefore, the value of 16 would be recorded, and the count value of the first counter 11 is reset as 0. Similarly, in the later oversampling operation, at the time t21, the sampled potential is also changed from the high potential VGH to the low potential VGL. In the meantime, a value of the first counter 11 is 48. Therefore, the value of 48 would also be recorded.

It is worth mentioning that the present embodiment determines whether transfer of the data signal 10" is performed according to the above determination whether the count value corresponding to the sampling point 100 with the potential changed is twice or more than the previously recorded count value. Specifically, when the potential of each of the re-counted sampling points 100 is again changed from the first potential to the second potential, if it is determined that the count value corresponding to the sampling point 100 with the potential changed is twice or more than the previously recorded count value, the count value recorded currently is defined as the first count value, the count value of the first counter is reset as 0, and transfer of the data signal 10" is performed (as the step S111 of FIG. 6).

The above description can also correspond to FIG. 3A for clear understanding. With reference to FIG. 3A, at the time t21, the potential of the sampling point 100 is once again changed from the high potential VGH to the low potential VGL, a count value corresponding to the sampling point 100 is 48, which is three times the previously recorded count value (i.e., 16). Therefore, the first count value would be defined as 48, and then the data signal 10" is transferred.

Then, after the first count value is obtained as described in a step S13 comprising defining a second count value based on the first count value. In the present embodiment, a functional relationship is defined between the first count value and the second count value. The functional relationship, for example, is a linear equation y=cx, wherein y is the second count value, x is the first count value, c is a constant. Similarly, the present embodiment also define different constants c before and after transfer of the data signal 10", not is not limited thereto. For example, before transfer of the data signal 10", c of the present embodiment is set as 1/3. Accordingly, during transfer of the data signal 10", c, for example, can be set as 1. With reference to FIGS. 3A-3B, before the data signal 10" is transferred (i.e., signal synchronization stage T1), the present embodiment sets a value of c as 1/3. Therefore, when the initial first count value is defined as a value of 48 at a time t21 in FIG. 3A, the initial second count value is calculated as a value of 16.

Then, with further reference to FIG. 3B, after the step S13, a step S14 is performed to define a unit interval. In short, after the step S13 of defining the second count value, the present embodiment performs the oversampling operation of the second count value to the data signal 10" by the second frequency to define a unit interval (UI). For example, when the above-mentioned initial first count value is defined as a value of 48 (as shown in FIG. 3A), the initial second count value is a value of 16. Based on the above-mentioned initial second count value is a value of 16, and therefore the present embodiment later would count times of the sampling points 100 to the value of 16 by a second counter 12 during the oversampling operation, and the interval is the defined unit interval.

Figure 5A:
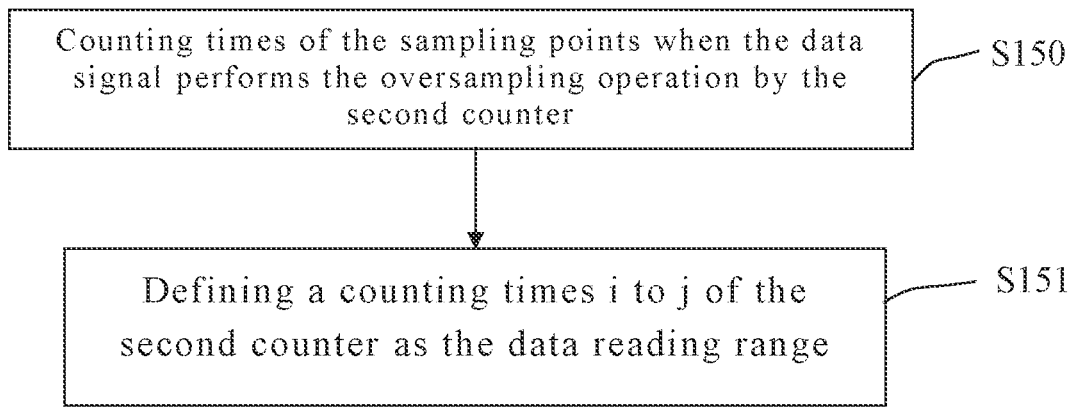
FIG. 5A illustrates a sub-flowchart of a step S15 in FIG. 4 of the present invention.

FIG. 5A illustrates a sub-flowchart of a step S15 in FIG. 4 of the present invention. With further reference to FIG. 5A, Then, after definition of the unit interval is defined (the step S14), the present embodiment further implement the step S15 as shown in FIG. 4: in the unit interval, defining a data reading range. In the present embodiment, the data reading range is shown in a shaded area 120 in FIG. 3B. In detail, after transmission of the data signal 10" is performed, the present embodiment would implement the step S150 in FIG. 5A: counting times of the sampling points 100 when the data signal 10" performs the oversampling operation by the second counter 12. For example, after transmission of data signal 10" is performed, the present embodiment would count the times of the sampling points 100 by the second counter 12 during the oversampling operation to a value of 16 (as shown in FIG. 3B). Furthermore, it is clearly understood from FIG. 3B that in a first unit interval UI' of the present embodiment, the oversampling operation is performed on the data signal 10" in which the second count value is 16. Namely, the present embodiment performs the oversampling operation on the data signal 10" in the unit interval UI' according to the second count value of 16. When the second counter 12 counts the times of the sampling points 100 to the second count value, the second counter 12 is reset as 0, and proceeds with a later counting operation according to the second count value defined by the second count value the renewed first count value. As such, a later unit interval UI''' can also be defined.

As described above, after the step S150 of FIG. 5A, the present embodiment is performed, for example, a step S151 is performed and comprises: defining a counting times i to j of the second counter 12 as the data reading range to only read in a range of the counting times i to j to achieve the objective of lowered cost and power consumption. In the present embodiment, the counting time i is obtained from a calculation formula: i=(m÷4)+k, the counting time j is obtained from a calculation formula: j=i+(m÷2), wherein m is the second count value; a remainder of m÷4 is 0 to 2, k is 0; when a remainder of m÷4 is 3, k is 1. Taking the unit interval UI' as an example, the second count value is a value of 16. Namely, m is 16. A remainder of m÷4 is 0, so k is 0. Therefore, the counting time i is calculated by the above equation as 4, the counting time j is also calculated by the above equation as 12. Therefore, the counting times 4 to 12 of the second counter 12 are defined as the data reading range (as shown in FIG. 3B).

Figure 5B:
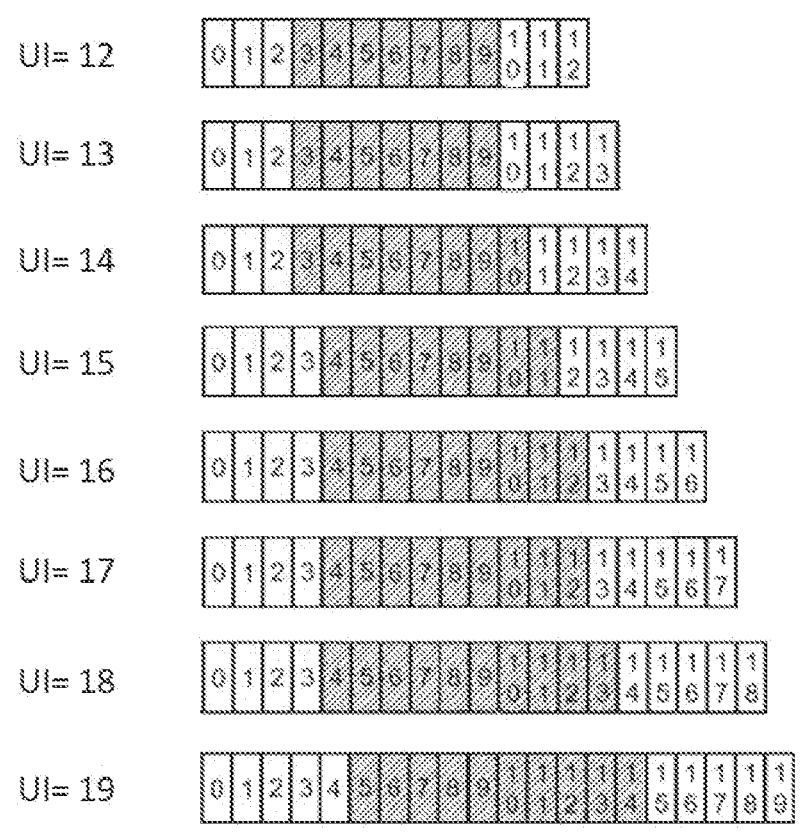

To more clearly understand the data reading range under different unit intervals, the present embodiment elaborates with FIG. 5B. FIG. 5B illustrates data reading ranges corresponding to different unit intervals of the present invention. With reference to FIG. 5B, to precisely read the data of the data signal 10", data reading ranges corresponding to the unit intervals are not all the same. For example, in the unit interval in which the second count value is 19, a corresponding data reading range is calculated as count values 5 to 14 of the second counter 12. Furthermore, in the unit interval of the second count value being 12, a corresponding data reading range is calculated as count values 3 to 9 of the second counter 12.

With reference to FIG. 4, after the step S15 defining a data reading range is completed, a step S16 is implemented and comprises reading data in the data reading range. Specifically, in the data reading range of each unit interval, when the potential of the counted sampling point 100 is changed from a first potential to a second potential, the data signal 10" corresponding to the data of the unit interval would be read as a first value. Accordingly, when the potential of the counted sampling point 100 is changed from the second potential to the first potential, the data signal 10" corresponding to the data of the unit interval would be read as a second value. In the present embodiment, the first potential is different from the second potential, and the first value is different from the second value. Furthermore, the first potential, for example, is a high potential VGH, and the second potential, for example, is a low potential VGL. Furthermore, the first value, for example, is 1, and the second value for example, is 0.

As such, the present embodiment further elaborates by taking the unit interval UI' as an example. With reference to FIG. 3B, In the present embodiment, at a time t30, data signal 10" $\angle$ potential of the sampling point 100, for example, is changed from a high potential VGH to a low potential VGL, and the time t30 of the sampling point 100 with the potential changed would be in the data reading range of counting times 4 to 12 of the second counter 12 (as described above). Therefore, data of the unit interval UI' of the data signal 10" would be read as 1. Specifically, the present embodiment would make a defined data reading range cover the time t30 of the sampling point 100 with the potential changed to further read out the data of the unit interval UI' of the data signal 10". As such, the present embodiment defines an interval of reading data during transmission of the digital signal 10, and samples and reads the digital signal 10 in the data reading range by employing an oversampling operation such that the present embodiment can effectively lower the cost and the power consumption and can also maintain correctness of reading the data signal 10".

In the same way, In the present embodiment, the data reading range defined based on UI" would also cover the time t31 of the sampling point 100 with the potential changed such that data of the unit interval UI" of the data signal 10" can also be read out. Specifically, in the unit interval UI", the potential of the sampling point 100 at the time t31 also has variation from the low potential VGL to the high potential VGH in the defined data reading range. Accordingly, data of the unit interval UI" in the data signal 10" can be read as 0.

It is worth mentioning that the present embodiment, while performing an oversampling operation on the sync signal 10', utilizes a definition manner of the first count value to obtain the first count value before transfer of the data signal 10". Accordingly, the present embodiment utilizes another definition manner of the first count value during transfer of the data signal 10", the manner is explained as follows: when the potential of the counted sampling point 100 in the data reading range is changed from a first potential to a second potential or from the second potential to the first potential, the count value of the sampling point with the potential changed is recorded and defined as the first count value. With reference to FIG. 3B, at the times t30, t32, t31, the potential of the sampling point 100 is changed from the high potential VGH to the low potential VGL or from the low potential VGL to the high potential VGH. Although different definition ways of the first count value are utilized during the above embodiment performing the oversampling operation on the sync signal 10' and data signal 10", but is not limited thereto. Namely, In other preferred embodiment, the same definition manner to the first count value can be made during oversampling operation to the sync signal 10' and data signal 10".

As described above, the present embodiment defines the first count value with values of 16, 18, and 20 at the times t30, t32, and t31 respectively. Accordingly, the second count value can be further defined according to the first count value. Especially, as described above, the present embodiment, defines the first count value and the second count value differently before and after transfer of the data signal 10", and during transfer of the data signal 10" of the present embodiment, the second count value is equal to the first count value. Furthermore, during transfer of the data signal 10", the second count value can be defied according to the first count value. Accordingly, the unit interval and data reading range can also be defined as described above and the present invention will not describe repeatedly herein.

As described above, with reference to FIG. 3A and FIG. 6 again, when and the potential of each of the counted sampling points 100 at which the data signal 10" is transferred is changed from the first potential to the second potential, the present embodiment determines whether a count value of the sampling point with the potential currently changed is twice or more than a previously recorded count value; if yes, transfer of the data signal 10" is terminated (as described in the step S112 in FIG. 6). With reference to FIG. 3A, at a time t24, the potential of the sampling point 100 is changed from the high potential VGH to the low potential VGL again, a count value corresponding to the sampling point 100 is 48, which is three times the previously recorded count value (i.e., 16). Therefore, transfer of the data signal 10" is terminated.

The present invention further explains the definition of the second count value in the step S13 in detail here: As described above, a definition of the second count value of the present embodiment depends on two conditions. Taking the functional relationship y=cx as an example, y is the second count value, x is the first count value, and c is a constant. In a first condition, c is set as 1/3 before transfer of the data signal 10" (i.e., signal synchronization stage T1). Therefore, at the time t21 in FIG. 3A with the initial first count value defined as a value of 48, the initial second count value is calculated as a value of 16. In a second condition, c is set as 1 during transfer of the data signal 10" (i.e., data transfer stage T2). Namely, the second count value is equal to the first count value. Furthermore, during the transfer of the data signal 10", the second count value can be directly defined in accordance with a corresponding first count value, and then the second count value is stored by the register 13. Taking the unit interval UI" as an example, at the time t31, the potential of the sampling point 100 is changed from the low potential VGL to the high potential VGH, a count value of the first counter 11 is 20, Therefore, the second count value corresponding to the unit interval UI" is calculated as 20.

Specifically, in the present embodiment to ensure that the data of data signal 10" can be read in the data reading range when the sampling frequency is shifted, the method of reading data of the present invention further comprises a self-calibration program comprising steps as follows: when the potential of each of the sampling points 100 counted in the data reading range is changed from the first potential to the second potential or from the second potential to the first potential, comparing a count value of the first counter 11 to a count value of the second counter 12 on the sampling point 100 with the potential changed; if the count value of the second counter 12 on the sampling point 100 with the potential changed is greater than a half of the count value of the first counter 11 on the sampling point 100 with the potential changed, increasing the counting times of the second counter 12; and if the count value of the second counter 12 on the sampling point 100 with the potential changed is less than the half of the count value of the first counter 11 on the sampling point 100 with the potential changed, decreasing the counting times of the second counter 12; wherein the counting times of the second counter 12 are increased or decreased according to a difference between the half of the count value of the first counter 11 on the sampling point 100 with the potential changed and the count value of the second counter 12 on the sampling point 100 with the potential changed.

Here, the present embodiment takes the unit interval UI'" as an example to describe the above self-calibration program. With further reference to FIG. 3B, at a time t32, a potential of the sampling point 100 is changed from a high potential VGH to a low potential VGL, a count value of the second counter 12 is 10, a count value of the first counter 11 is 18. Namely, at the time t32, the count value (value of 10) of the second counter 12 is greater than half of the count value (value of 9) of the first counter 11. Therefore, the self-calibration program of the present embodiment would increase the counting times of the second counter 12. Furthermore, the present embodiment would increase or decrease the counting times of the second counter 12 according to difference between the half of the count value of the first counter 11 and the count value of the second counter 12 deemed as an offset amount. For example, at the time t32, the half of the count value of the first counter 11 is 9, and a count value of the second counter 12 is 10, so a difference therebetween is 1. Furthermore, the count value of the second counter 12 is greater than half of the count value of the first counter 11 and the difference therebetween is 1, therefore the self-calibration program of the present embodiment would increase the counting times of the second counter 12 by 1. Namely, the count value of the second counter 12 would be increased from a value of 18 to a value of 19. As such, after the self-calibration program of the present embodiment, the sampling points 100 with potential changed are effectively located in a central area of the unit interval to guarantee that the data of the data signal 10" can be read in the data reading range.

Furthermore, In the present embodiment, the first counter 11 and the second counter 12 are reset as 0 to proceed with a later counting operation. In other preferred embodiment, the first counter 11 and the second counter 12 can accumulatively count to proceed with the later counting operation instead of being reset to 0. Namely, the present invention has no limit to the counting manner of the first counter 11 and the second counter 12.

Figure 7:
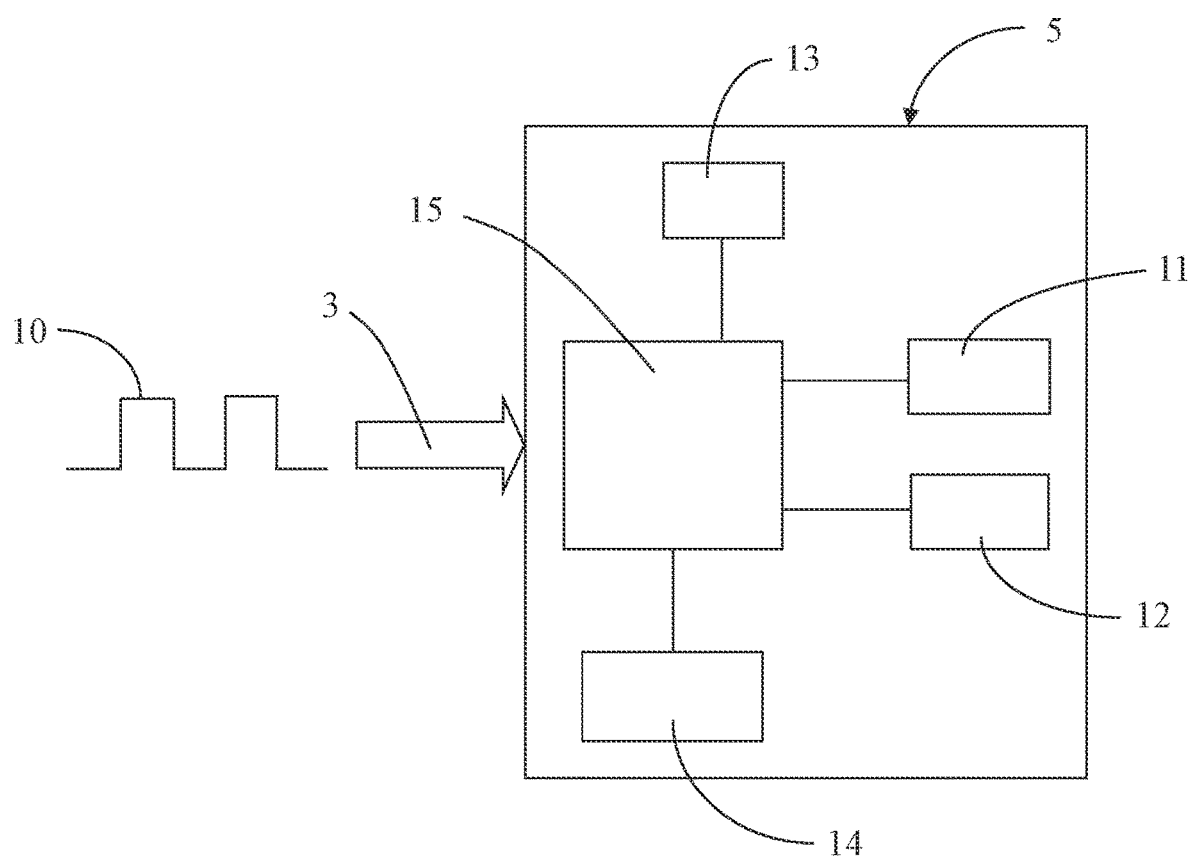
FIG. 7 illustrates a diagram of a data reading device of an embodiment of the present invention.

FIG. 7 illustrates a diagram of a data reading device of an embodiment of the present invention. The data reading device 5 of the present invention is configured to read data of a digital signal 10 including a first frequency. The digital signal comprises a sync signal and a data signal. The data reading device 5, for example, comprises: a first counter 11, a register 13, an oscillator 14, and a control unit 15. The first counter 11, the register 13, and the oscillator 14, for example, are coupled to the control unit 15. In the present embodiment, the data reading device 5 reads data of the digital signal 10 through a communication interface. The communication interface, for example, is a DisplayPort interface.

With reference to FIG. 7, the oscillator 14 is configured to generate a second frequency, wherein the second frequency is greater than the first frequency. In an embodiment, the second frequency is n times the first frequency, and the n is an integer greater than 1. In an embodiment, the first frequency is 1 MHz, and the second frequency ranges from 12 MHz to 16 MHz.

The first counter 11 is configured to count the sampling points to obtain a first count value. The register 13 is configured to store an amount of the sampling points. The control unit 15 is configured to perform: performing an oversampling operation to the digital signal by the second frequency, and calculating a plurality of sampling points according to the oversampling operation; defining a second count value based on the first count value; performing the oversampling operation of the second count value to the data signal by the second frequency to define a unit interval; in the unit interval, defining a data reading range; and in the data reading range, when a potential of each of the sampling points counted is changed from a first potential to a second potential, determining that data of the data signal corresponding to the unit interval is a first value, when the potential of each of the sampling points counted is changed from the second potential to the first potential, determining that data of the data signal corresponding to the unit interval is a second value, wherein the first potential is different from the second potential, and the first value is different from the second value.

Furthermore, the control unit 15 is configured to perform: when the potential of each of the sampling points counted in the data reading range is changed from the first potential to the second potential or from the second potential to the first potential, recording and defining a count value of the sampling point with the potential changed as the first count value, and resetting a count value of the first counter as 0.

Furthermore, control unit 15 is configured to perform: performing the oversampling operation to the sync signal to obtain the first count value before transfer of the data signal; when the potential of each of the sampling points counted is changed from the first potential to the second potential, recording a count value corresponding to the sampling points with the potential changed, and resetting a count value of the first counter as 0, and re-counting; and when the potential of each of the sampling points re-counted is changed from the first potential to the second potential once again, determining that whether the count value of each of the sampling points with the potential currently changed is twice or more than a previously recorded count value; if yes, the count value recorded currently is defined as the first count value, and resetting the count value of the first counter as 0, and performing transfer of the data signal.

Furthermore, control unit 15 is configured to perform: when the potential of each of the sampling points counted with transfer of the data signal is changed from the first potential to the second potential, determining whether a count value of each of the sampling points with the potential currently changed is twice or more than a previously recorded count value; if yes, terminating the transfer of the data signal.

Furthermore, the control unit 15 is further configured to perform: defining a count value of the first counter corresponding to each of the sampling points with the potential changed in each of the data reading ranges as the second count value; and instructing the register 13 to store the second count value.

With reference to FIG. 7, the data reading device 5 further comprises a second counter 12 configured to count the sampling points when the data signal performs the oversampling operation. The second counter 12 is also coupled to the control unit 15. In the present embodiment, the control unit 15 is configured to performing: performing the oversampling operation to the data signal in the unit interval according to the second count value, and resetting the second counter as 0 when the unit interval is over; defining counting times i to j of the second counter as the data reading range; wherein the counting time i is obtained from a calculation formula: i=(m÷4)+k, the counting time j is obtained from a calculation formula: j=i+(m÷2), wherein m is the second count value; a remainder of m÷4 is 0 to 2, k is 0; when a remainder of m÷4 is 3, k is 1.

Furthermore, the control unit 15 is configured to perform: when the potential of each of the sampling points counted in the data reading range is changed from the first potential to the second potential or from the second potential to the first potential, comparing a count value of the first counter to a count value of the second counter on the sampling point with the potential changed; if the count value of the second counter on the sampling point with the potential changed is greater than a half of the count value of the first counter on the sampling point with the potential changed, increasing the counting times of the second counter; and if the count value of the second counter on the sampling point with the potential changed is less than the half of the count value of the first counter on the sampling point with the potential changed, decreasing the counting times of the second counter; wherein the counting times of the second counter are increased or decreased according to a difference between the half of the count value of the first counter on the sampling point with the potential changed and the count value of the second counter on the sampling point with the potential changed.

In other embodiment, the second frequency can be preferably selected to range from 12 MHz to 16 MHz, but is not limited thereto.

As described above, the present invention mainly employs the over-sampling method to synchronize a digital signal and correctly obtain data. Furthermore, the present invention only uses an oscillator without using phase-locked loops (PLLs). Therefore, the present invention can effectively lower the cost and power consumption.

Although the present invention is described with preferred embodiments as above, it is not used to limit the present invention. Those with ordinary knowledge in the technical field of the present invention can implement changes and modifications without departing from the spirit and scope of the present invention. Therefore, the scope of protection of the present invention shall be subject to the scope of the attached patent application.

What is claimed is:

1. A method of reading data, comprising:
   receiving a digital signal comprising a first frequency, wherein the digital signal comprises a sync signal and a data signal;
   generating a second frequency by an oscillator to perform an oversampling operation to the digital signal, and calculating a plurality of sampling points according to the oversampling operation, wherein the second frequency is greater than the first frequency;
   counting the sampling points by a first counter to obtain a first count value;
   defining a second count value based on the first count value;
   performing the oversampling operation of the second count value to the data signal by the second frequency to define a unit interval;
   in the unit interval, defining a data reading range; and
   in the data reading range, reading the data signal corresponding to data of the unit interval as a first value when a potential of each of the sampling points counted is changed from a first potential to a second potential, reading the data signal corresponding to the data of the unit interval as a second value when the potential of each of the sampling points counted is changed from the second potential to the first potential;
   wherein the first potential is different from the second potential, and the first value is different from the second value.

2. The method of reading data as claimed in claim 1, wherein when the potential of each of the sampling points counted in the data reading range is changed from the first potential to the second potential or from the second potential to the first potential, a count value of the sampling point with the potential changed is recorded and defined as the first count value, and a count value of the first counter is reset as 0.

3. The method of reading data as claimed in claim 1, wherein the step of performing the oversampling operation to the digital signal comprises performing the oversampling operation to the sync signal to obtain the first count value before transfer of the data signal, wherein the step of performing the oversampling operation to the sync signal comprises:
   when the potential of each of the sampling points counted is changed from the first potential to the second potential, recording a count value corresponding to the sampling points with the potential changed, and resetting a count value of the first counter as 0 and is re-counts; and
   when the potential of each of the sampling points re-counted is changed from the first potential to the second potential once again, determining that whether the count value of each of the sampling points with the potential currently changed is twice or more than a previously recorded count value;
   if yes, defining the count value recorded currently as the first count value, and resetting the count value of the first counter as 0, and performing transfer of the data signal.

4. The method of reading data as claimed in claim 3, further comprising:
   when the potential of each of the sampling points counted with transfer of the data signal is changed from the first potential to the second potential, determining whether a count value of each of the sampling points with the potential currently changed is twice or more than a previously recorded count value;
   if yes, terminating the transfer of the data signal.

5. The method of reading data as claimed in claim 1, further comprising:
   defining a count value of the first counter corresponding to each of the sampling points with the potential changed in each of the data reading ranges as the second count value; and
   storing the second count value by a register.

6. The method of reading data as claimed in claim 1, further comprising:
   counting times of the sampling points when the data signal performs the oversampling operation by a second counter, wherein the oversampling operation is performed to the data signal in the unit interval according to the second count value, and when the unit interval is over, the second counter is reset as 0.

7. The method of reading data as claimed in claim 6, wherein the step of defining the data reading range comprising:
   defining counting times i to j of the second counter as the data reading range;
   wherein the counting time i is obtained from a calculation formula: $i=(m \div 4)+k$, the counting time j is obtained from a calculation formula: $j=i+(m \div 2)$, wherein m is the second count value; a remainder of $m \div 4$ is 0 to 2, k is 0; when a remainder of $m \div 4$ is 3, k is 1.

8. The method of reading data as claimed in claim 6, further comprising:
   when the potential of each of the sampling points counted in the data reading range is changed from the first potential to the second potential or from the second potential to the first potential, comparing a count value of the first counter to a count value of the second counter on the sampling point with the potential changed;
   if the count value of the second counter on the sampling point with the potential changed is greater than a half of the count value of the first counter on the sampling point with the potential changed, increasing the counting times of the second counter; and if the count value of the second counter on the sampling point with the potential changed is less than the half of the count value of the first counter on the sampling point with the potential changed, decreasing the counting times of the second counter;

wherein the counting times of the second counter are increased or decreased according to a difference between the half of the count value of the first counter on the sampling point with the potential changed and the count value of the second counter on the sampling point with the potential changed.

9. The method of reading data as claimed in claim 1, wherein a functional relationship is defined between the first count value and the second count value.

10. The method of reading data as claimed in claim 1, wherein the second frequency is n times the first frequency, and the n is an integer greater than 1.

11. A data reading device, configured to read a digital signal comprising a first frequency, wherein the digital signal comprises a sync signal and a data signal, the data reading device comprises:
   an oscillator configured to generate a second frequency, wherein the second frequency is greater than the first frequency;
   a first counter configured to count the sampling points to obtain a first count value; and
   a control unit configured to perform:
   performing an oversampling operation to the digital signal by the second frequency, and calculating a plurality of sampling points according to the oversampling operation;
   defining a second count value based on the first count value;
   performing the oversampling operation of the second count value to the data signal by the second frequency to define a unit interval;
   in the unit interval, defining a data reading range; and
   in the data reading range, when a potential of each of the sampling points counted is changed from a first potential to a second potential, determining that data of the data signal corresponding to the unit interval is a first value, when the potential of each of the sampling points counted is changed from the second potential to the first potential, determining that data of the data signal corresponding to the unit interval is a second value, wherein the first potential is different from the second potential, and the first value is different from the second value.

12. The data reading device as claimed in claim 11, wherein the control unit is configured to perform:
   when the potential of each of the sampling points counted in the data reading range is changed from the first potential to the second potential or from the second potential to the first potential, recording and defining a count value of the sampling point with the potential changed as the first count value, and resetting a count value of the first counter as 0.

13. The data reading device as claimed in claim 11, wherein the control unit is configured to perform:
   performing the oversampling operation to the sync signal to obtain the first count value before transfer of the data signal;
   when the potential of each of the sampling points counted is changed from the first potential to the second potential, recording a count value corresponding to the sampling points with the potential changed, and resetting a count value of the first counter as 0, and re-counting; and
   when the potential of each of the sampling points re-counted is changed from the first potential to the second potential once again, determining that whether the count value of each of the sampling points with the potential currently changed is twice or more than a previously recorded count value;
   if yes, the count value recorded currently is defined as the first count value, and resetting the count value of the first counter as 0, and performing transfer of the data signal.

14. The data reading device as claimed in claim 13, wherein the control unit is configured to perform:
   when the potential of each of the sampling points counted with transfer of the data signal is changed from the first potential to the second potential, determining whether a count value of each of the sampling points with the potential currently changed is twice or more than a previously recorded count value;
   if yes, terminating the transfer of the data signal.

15. The data reading device as claimed in claim 11, further comprising a register, wherein the control unit is further configured to perform:
   defining a count value of the first counter corresponding to each of the sampling points with the potential changed in each of the data reading ranges as the second count value; and
   instructing the register to store the second count value.

16. The data reading device as claimed in claim 11, further comprising a second counter configured to perform counting the data signal during the oversampling operation according to the second count value, wherein the control unit is configured to perform the oversampling operation to the data signal in the unit interval according to the second count value, and reset the second counter as 0 when the unit interval is over.

17. The data reading device as claimed in claim 16, wherein the control unit is configured to perform:
   defining counting times i to j of the second counter as the data reading range;
   wherein the counting time i is obtained from a calculation formula: i=(m÷4)+k, the counting time j is obtained from a calculation formula: j=i+(m÷2), wherein m is the second count value; a remainder of m÷4 is 0 to 2, k is 0; when a remainder of m÷4 is 3, k is 1.

18. The data reading device as claimed in claim 16, wherein the control unit is configured to perform:
   when the potential of each of the sampling points counted in the data reading range is changed from the first potential to the second potential or from the second potential to the first potential, comparing a count value of the first counter to a count value of the second counter on the sampling point with the potential changed;
   if the count value of the second counter on the sampling point with the potential changed is greater than a half of the count value of the first counter on the sampling point with the potential changed, increasing the counting times of the second counter; and
   if the count value of the second counter on the sampling point with the potential changed is less than the half of the count value of the first counter on the sampling point with the potential changed, decreasing the counting times of the second counter;

wherein the counting times of the second counter are increased or decreased according to a difference between the half of the count value of the first counter on the sampling point with the potential changed and the count value of the second counter on the sampling point with the potential changed.

19. The data reading device as claimed in claim 11, wherein a functional relationship is defined between the first count value and the second count value.

20. The data reading device as claimed in claim 11, wherein the second frequency is n times the first frequency, and the n is an integer greater than 1.

* * * * *